US009496157B2

(12) United States Patent
Hung et al.

(10) Patent No.: US 9,496,157 B2
(45) Date of Patent: Nov. 15, 2016

(54) ULTRAVIOLET CURING APPARATUS HAVING TOP LINER AND BOTTOM LINER MADE OF LOW-COEFFICIENT OF THERMAL EXPANSION MATERIAL

(71) Applicant: Taiwan Semiconductor Manufacturing CO., LTD., Hsinchu (TW)

(72) Inventors: Teng-Da Hung, Kaohsiung (TW); Liang-Chang Hsieh, Taichung (TW); Chun-Lung Lin, Changhua County (TW); Hsin-Hung Chi, New Taipei (TW); Yun-Wen Chu, Kaohsiung (TW); Jiun-Wei Su, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 14 days.

(21) Appl. No.: 14/079,945

(22) Filed: Nov. 14, 2013

(65) Prior Publication Data
US 2015/0132973 A1 May 14, 2015

(51) Int. Cl.
*H01L 21/00* (2006.01)
*H01L 21/67* (2006.01)

(52) U.S. Cl.
CPC ..... *H01L 21/67115* (2013.01); *H01L 21/6719* (2013.01)

(58) Field of Classification Search
CPC ............. F27B 17/0025; H01L 21/67115; H01L 21/6719; H01L 21/02348; H01L 21/67155; H01L 21/67017
USPC ................................. 438/795; 250/432 R
See application file for complete search history.

(56) References Cited

U.S. PATENT DOCUMENTS

| 5,378,924 A * | 1/1995 | Liang ..................... 257/675 |
| 5,835,334 A * | 11/1998 | McMillin et al. ........... 361/234 |
| 6,299,078 B1 * | 10/2001 | Fugere ..................... 239/591 |
| 7,935,885 B2 * | 5/2011 | Elie et al. ................. 174/36 |
| 2007/0298362 A1 * | 12/2007 | Rocha-Alvarez et al. ....... 432/9 |
| 2012/0067845 A1 * | 3/2012 | Monden et al. ............. 216/69 |
| 2013/0213448 A1 * | 8/2013 | Moczygemba et al. ....... 136/201 |

FOREIGN PATENT DOCUMENTS

| TW | 200600911 | 1/2006 |
| WO | WO-2010/039945 | 4/2010 |

* cited by examiner

*Primary Examiner* — Duy T Nguyen

(57) ABSTRACT

An ultraviolet curing apparatus includes a chamber, a gas flow generator, and an ultraviolet lamp. The gas flow generator includes a top liner and a bottom liner coupled to each other. The top liner and the bottom liner are disposed in the chamber, and are made of low-coefficient of thermal expansion material. The ultraviolet lamp is disposed on the chamber and is configured for providing ultraviolet light.

20 Claims, 3 Drawing Sheets

ULTRAVIOLET CURING APPARATUS HAVING TOP LINER AND BOTTOM LINER MADE OF LOW-COEFFICIENT OF THERMAL EXPANSION MATERIAL

BACKGROUND

1. Technical Field

The present disclosure relates to an ultraviolet curing apparatus. More particularly, the present disclosure relates to an ultraviolet curing apparatus having a top liner and a bottom liner both made of low-coefficient of thermal expansion material.

2. Description of Related Art

For manufacturing semiconductor devices, many processes and techniques may be included in the manufacturing process, and ultraviolet curing process may be one of them. For the ultraviolet curing process, a wafer can be disposed in an ultraviolet curing apparatus to be ultraviolet cured. During the curing process, the wafer may be heated in a chamber of the ultraviolet curing apparatus. Some materials in the wafer may be released from the wafer and be distributed in the chamber. A gas flow generator can be disposed in the chamber to generate a gas flow in the chamber to remove the materials.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

As used herein, the terms "comprising," "including," "having," "containing," "involving," and the like are to be understood to be open-ended, i.e., to mean including but not limited to.

Throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
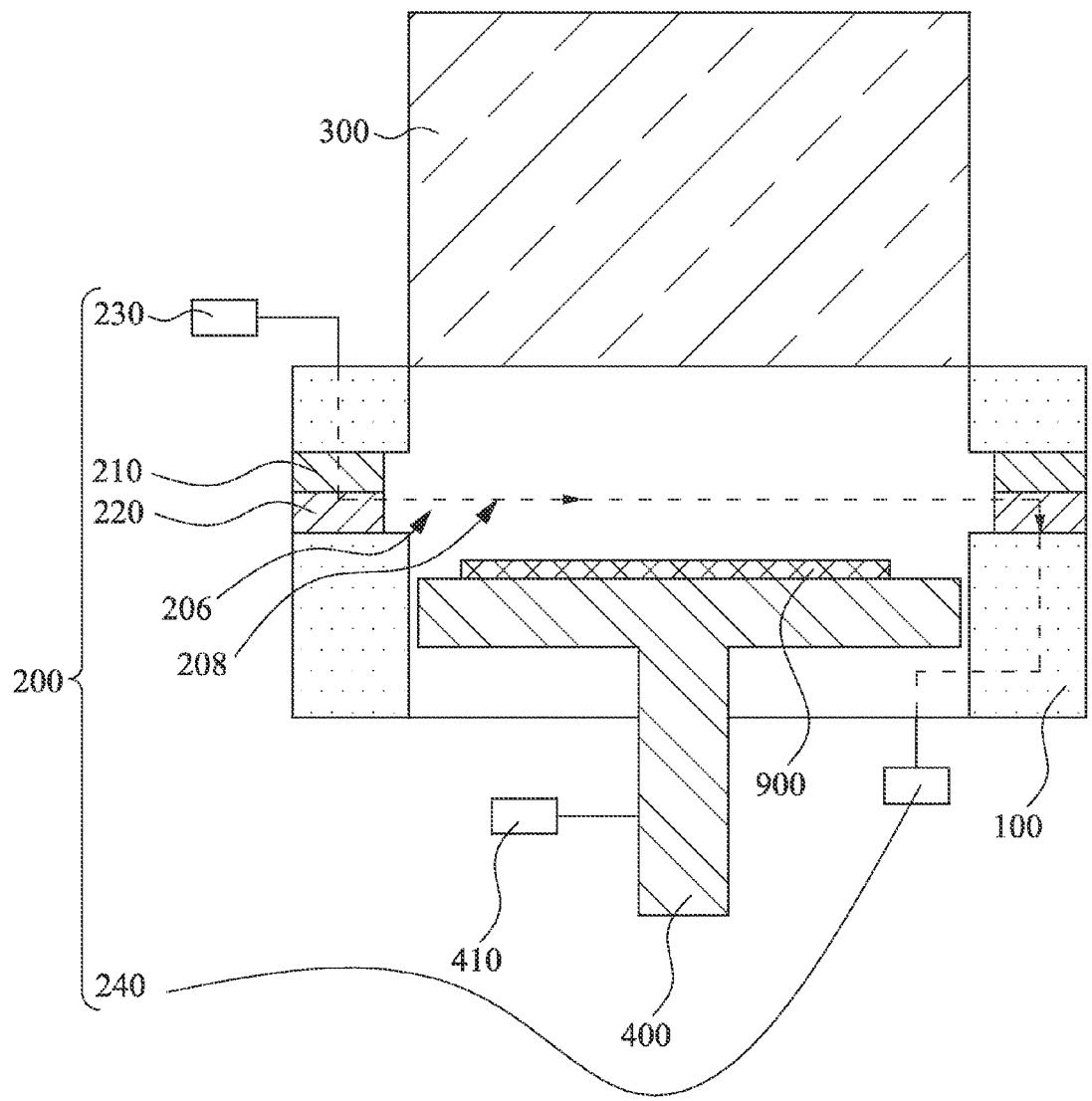
FIG. 1 is a cross-sectional view of an ultraviolet curing apparatus according to one or various embodiments of the present disclosure.

FIG. 1 is a cross-sectional view of an ultraviolet curing apparatus according to one or various embodiments of the present disclosure. The ultraviolet curing apparatus includes a chamber 100, a gas flow generator 200, and an ultraviolet lamp 300. The gas flow generator 200 includes a top liner 210 and a bottom liner 220 coupled to each other. The top liner 210 and the bottom liner 220 are disposed in the chamber 100, and are made of low-coefficient of thermal expansion material. The ultraviolet lamp 300 is disposed on the chamber 100 and is configured for providing ultraviolet light.

In one or more embodiments, the ultraviolet curing apparatus further includes a plate 400 disposed in the chamber 100 configured for supporting a wafer 900. The top liner 210 is disposed above the plate 400, and the bottom liner 220 is detachably coupled to the top liner 210 and disposed between the top liner 210 and the plate 400. The ultraviolet lamp 300 is further configured for curing the wafer 900.

During the curing process, since the ultraviolet light provided by the ultraviolet lamp 300 may heat the chamber 100 from above the chamber 100, the temperature in the chamber 100 may be not spatially uniform. Therefore, a temperature of the top liner 210 and a temperature of the bottom liner 220 may be different. In general, the top liner and the bottom liner are made of metal, such as aluminum (Al). Frictions may exist between the top liner and the bottom liner, such that metal particles may be produced from the frictions between the top liner and the bottom liner. The metal particles may fall on the wafer, which makes the wafer invalid.

However, in this embodiment, since the top liner 210 and the bottom liner 220 are made of low-coefficient of thermal expansion material, the expansions of the top liner 210 and the bottom liner 220 may be not significant. In this way, the rub problem between the top liner 210 and the bottom liner 220 can be improved, and so can the metal particle problem.

In one or more embodiments, a coefficient of thermal expansion (CTE) of the low-coefficient of thermal expansion material may be about $1 \times 10^{-6}/^\circ$ C. to $1 \times 10^{-5}/^\circ$ C. For example, the low-coefficient of thermal expansion material may be made of ceramic, and the material of the ceramic may be aluminum oxide ($Al_2O_3$) (whose CTE is about $8 \times 10^{-6}/^\circ$ C.), silicon carbon (SiC) (whose CTE is about $4.1 \times 10^{-6}/^\circ$ C.~$5.2 \times 10^{-6}/^\circ$ C.), zirconium oxide ($ZrO_2$) (whose CTE is about $9.5 \times 10^{-6}/^\circ$ C.), silicon oxide ($Si_3O_4$) (whose CTE is about $2.0 \times 10^{-6}/^\circ$ C.~$4 \times 10^{-6}/^\circ$ C.), or any combination thereof. It should be noticed that the material of the low-coefficient of thermal expansion material are illustrative, and should not limit the claimed scope. A person having ordinary skill in the art may select a proper material for the low-coefficient of thermal expansion material according to actual requirements.

In this embodiment, the ceramic not only has low coefficient of thermal expansion, but also has low friction coefficient. Therefore, despite frictions may exist between the top liner 210 and the bottom liner 220 during the curing process, the frictions may be too small to produce particles between the top liner 210 and the bottom liner 220. Therefore, the wafer pollution issue can be avoided.

Figure 2:
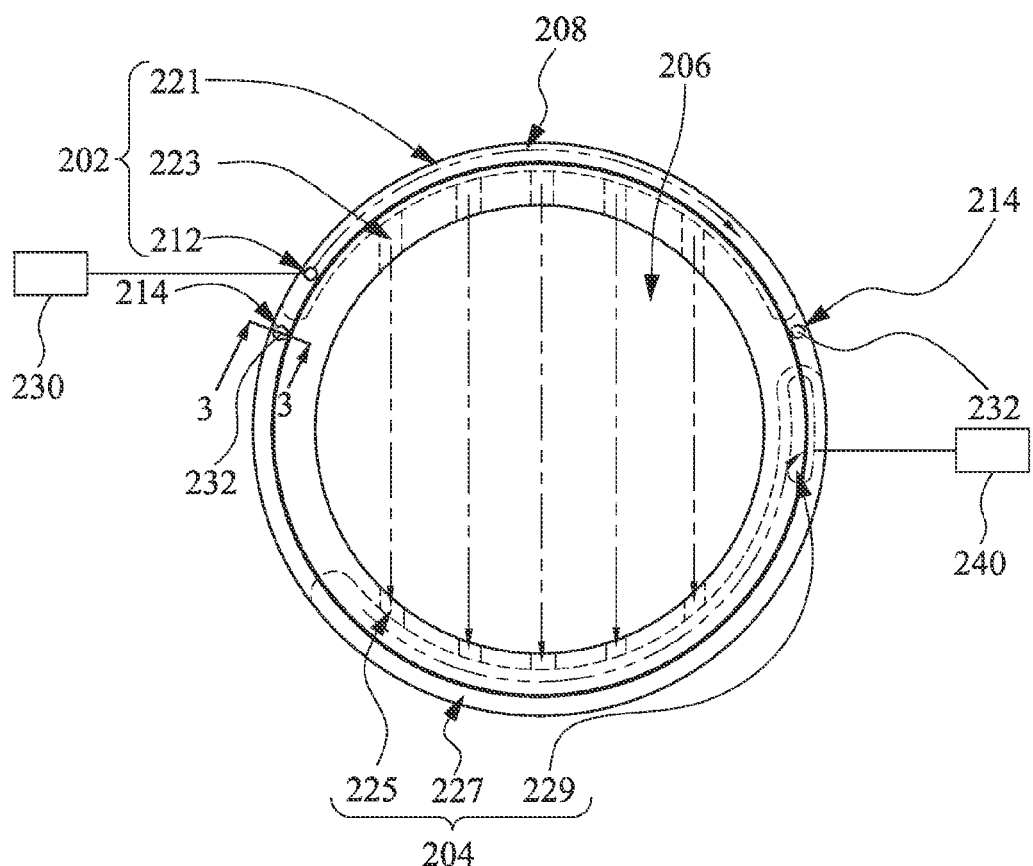
FIG. 2 is a top view of the gas flow generator of FIG. 1.
Figure 3:
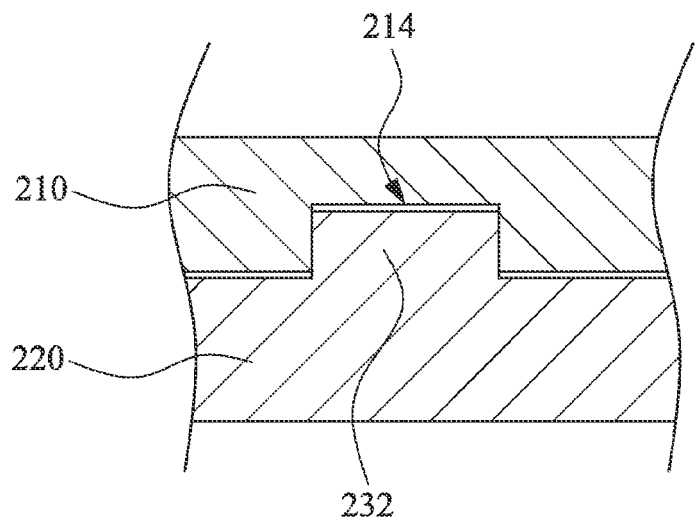
FIG. 3 is a cross-sectional view taken along line 3-3 in FIG. 2.

FIG. 2 is a top view of the gas flow generator 200 of FIG. 1, and FIG. 3 is a cross-sectional view taken along line 3-3 in FIG. 2. As shown in FIG. 2 and FIG. 3, in one or more embodiments, for coupling the top liner 210 and the bottom liner 220 to each other, the top liner 210 may have at least one recess 214, and the bottom liner 220 may include at least one pin 232, the pin 232 is tightly coupled to the recess 214. In other words, the pin 232 and the recess 214 are form a tight fit. For example, in FIG. 2, the top liner 210 has two recesses 214, and the bottom liner 220 includes two pins 232. To couple the top liner 210 and the bottom liner 220, the pins 232 of the bottom liner 220 can be inserted into the recesses 214 of the top liner 210, respectively. As mentioned above, since the top liner 210 and the bottom liner 220 are made of low-coefficient of thermal expansion material, the expansion difference between the top liner 210 and the bottom liner 220 during the curing process may be small, which means the sizes of the recesses 214 and the pins 232 may not change during the curing process. Therefore, the pins 232 can be tightly coupled to the recesses 214, i.e., the bottom liner 220 is tightly coupled to the top liner 210, to form a tight fit and reduce or restrain the sliding motion between the top liner 210 and the bottom liner 220, and also to strengthen the whole structure of the gas flow generator 200.

In one or more embodiments, a shape of each of the pins 232 may be cylindrical, and a shape of each of the recesses 214 may be round. In this way, the stress formed around the pins 232 and/or the recesses 214 can be distributed uniformly, which prevents the damage of the pins 232 and the recesses 214. Furthermore, the frictions between the pins 232 and the recesses 214 can be further reduced. However, the shapes of the pins 232 and the recesses 214 are not limited to the shape mentioned above. In other embodiments, the shape of each of the pins 232 may be, but should be not limited to, oval, and the shape of each of the recesses 214 may be, but should be not limited to, oval, too. Basically, the shapes of each of the pins 232 and each of the recesses 214 are not limited as long as the shapes of the pin 232 and the recess 214 are complimentary, and the edge of the recess 214 can be tightly around the pin 232.

It should be noticed that although the top liner 210 has two recesses 214, and the bottom liner 220 has two pins 232 in this embodiment, the scope of the claimed disclosure should not limited to this aspect. In other embodiments, the top liner 210 may include at least one pin, and the bottom liner 220 may have at least one recess. The pin of the top liner 210 can be inserted into the recess of the bottom liner 220 when the top liner 210 is coupled to the bottom liner 220. Still in other embodiments, the top liner 210 may include at least one pin and at least one recess, and the bottom liner 220 may include at least one pin and at least one recess, too. The pin of the top liner 210 can be inserted into the recess of the bottom liner 220, and the pin of the bottom liner 220 can be inserted into the recess of the top liner 210 when the top liner 210 is coupled to the bottom liner 220.

Reference is made back to FIG. 1. In this embodiment, some kind of wafer 900 may be ultraviolet cured under a temperature higher than the room temperature, such that the plate 400 can include a heater 410 configured for heating the wafer 900 during the curing process. For example, the heater 410 can heat the wafer 900 to 385° C. during the curing process. However, the scope of the claimed disclosure should be not limited to this aspect.

Reference is made both to FIG. 1 and FIG. 2. In this embodiment, the top liner 210 and the bottom liner 220 are both ring-shaped, and the top liner 210 and the bottom liner 220 are form an opening 206 therein. The opening 206 exposes the wafer 900, and therefore the ultraviolet lamp 300 can illuminate the wafer 900 through the opening 206.

During the curing process, the heater 410 can heat the wafer 900 to a predetermined temperature (for example, 385° C.), and a portion of the heat may transfer to the bottom liner 220, such that the bottom liner 220 may be heated by the heater 410 indirectly. In addition, when the ultraviolet lamp 300 illuminates the wafer 900, the ultraviolet light may heat the chamber 100 from above the chamber 100. Therefore, the ultraviolet light may also heat the top liner 210 from the top thereof, which causes the temperature difference between the top liner 210 and the bottom liner 220. However, since the top liner 210 and the bottom liner 220 are made of the low-coefficient of thermal expansion material, the frictions between the top liner 210 and the bottom liner 220 caused by the expansion effect can be reduced. When the frictions are reduced, there can be no particle produced between the top liner 210 and the bottom liner 220, such that the wafer pollution issue can be solved, and the yield rate of the wafer 900 can be improved.

Reference is made back to FIG. 1. In this embodiment, the gas flow generator 200 can further include a gas supplier 230 and a pump 240. The gas supplier 230 is configured for providing gas to the chamber 100, and the pump 240 is configured for pumping out the gas in the chamber 100. The gas supplier 230 and the pump 240 are disposed opposite to each other.

In greater detail, some materials may be released from the wafer 900 when the wafer 900 is ultraviolet cured by the ultraviolet light. These materials may be distributed in the chamber 100 and become exhaust. The gas flow generator 200 can remove the exhaust through generating a gas flow 208 in the chamber 100. Specifically, the gas supplier 230 can be connected to the top liner 210. Therefore, gas provided by the gas supplier 230 can flow to the chamber 100 through the top liner 210 and the bottom liner 220. On the other hand, the pump 240 can be connected to the bottom liner 220. The pump 240 can pump out the gas and the exhaust in the chamber 100 through the bottom liner 220. Therefore, the gas flow 208 can be generated in the chamber 100 by the gas flow generator 200, and the exhaust can be removed from the chamber 100.

Figure 4:
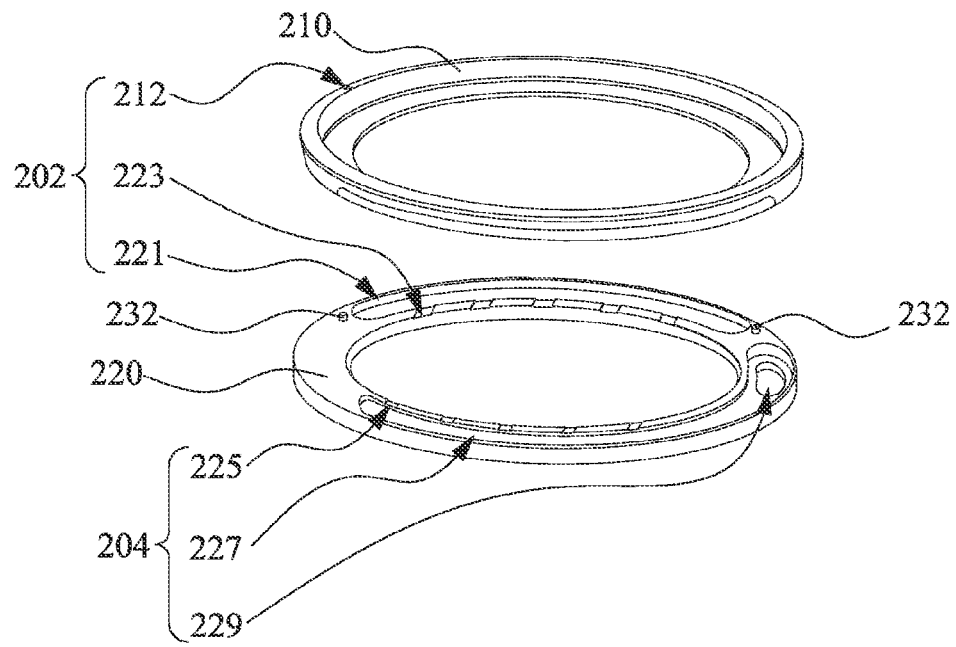
FIG. 4 is an exploded diagram of the top liner and the bottom liner of FIG. 1.

The following paragraphs provide detailed explanations with respect to the structure of the top liner 210 and the bottom liner 220. FIG. 4 is an exploded diagram of the top liner 210 and the bottom liner 220 of FIG. 1. Reference is made both to FIG. 2, and FIG. 4. In this embodiment, the top liner 210 and the bottom liner 220 form an inlet gas flow channel 202 and an outlet gas flow channel 204 separated from each other. For example, the inlet gas flow channel 202 and the outlet gas flow channel 204 can be disposed at opposite sides of the opening 206. The gas supplier 230 can be connected to the inlet gas flow channel 202, and the pump 240 can be connected to the outlet gas flow channel 204. Therefore, the gas supplier 230 can provide the gas to the inlet gas flow channel 202, such that the gas can flow to the opening 206 and into the chamber 100 (see FIG. 1) along the inlet gas flow channel 202. Furthermore, the gas and the exhaust in the chamber 100 can together flow to the outlet gas flow channel 204, and then are pumped out from the chamber 100 by the pump 240.

In one or more embodiment, the top liner 210 may have a first inlet hole 212, and the bottom liner 220 may have a first groove 221 and at least one first outlet hole 223. The first groove 221 is connected to the first inlet hole 212 and the first outlet holes 223 to form the inlet gas flow channel 202. Taking FIG. 2 and FIG. 4 as an example, the first inlet hole 212 is a through hole, and the gas supplier 230 can be connected to the first inlet hole 212 and provide the gas to the first groove 221 via the first inlet hole 212. The top liner 210 has five first outlet holes 223, and the first outlet holes 223 are disposed facing the opening 206. Therefore, the gas provided by the gas supplier 230 can sequentially flow to the first inlet hole 212 and the first groove 221, and then leave the inlet gas flow channel 202 into the chamber 100 (see FIG. 1) via the first outlet holes 223. It should be noticed that the number of the first outlet holes 223 are illustrative, and should not limit the claimed scope of the present disclosure. A person having ordinary skill in the art may design the number of the first outlet holes 223 according to actual requirements.

Moreover, the bottom liner 220 may further have at least one second inlet hole 225, a second groove 227, and a second outlet hole 229. The second groove 227 is connected to the second inlet hole 225 and the second outlet hole 229 to form the outlet gas flow channel 204. Taking FIG. 2 and FIG. 4 as an example, the bottom liner 220 has five second inlet holes 225 disposed facing the opening 206 and opposite to the first inlet holes 223. Therefore, the gas and the exhaust can flow into the outlet gas flow channel 204 via the second inlet holes 225. In addition, the second outlet hole 229 can be a through hole, and the pump 240 can be connected to the second outlet hole 229 to pump out the gas in the outlet gas flow channel 204. In other words, the gas and the exhaust in the chamber 100 (see FIG. 1) can be pumped to the pump 240 through the second inlet holes 225, the second groove 227, and the second outlet holes 229 in sequence. It should be noticed that the number of the second inlet holes 225 are illustrative, and should not limit the claimed scope of the present disclosure. A person having ordinary skill in the art may design the number of the second inlet holes 225 according to actual requirements.

In this embodiment, as shown in FIG. 2, the first outlet holes 223 and the second inlet holes 225 are disposed at the opposite sides of the opening 206. The first outlet holes 223 and the second inlet holes 225 can be small holes with flat apertures, such that the gas flow 208 generated at the opening 206 can be a laminar flow, leading to a more uniform flow in the chamber 100 (see FIG. 1). Furthermore, the laminar flow can be adjusted by the positions and/or the sizes of the first outlet holes 223 and the second inlet holes 225 according to the actual requirements, the scope of the claimed disclosure should not be limited in the respect shown in FIG. 2 and FIG. 4.

It is understood that the embodiment of the ultraviolet curing apparatus mentioned above is provided merely as examples and are not intended to be limiting. The ultraviolet curing apparatus may have different configurations consistent with the spirit of the present disclosure in alternative embodiments depending on design requirements and manufacturing concerns.

Figure 5:
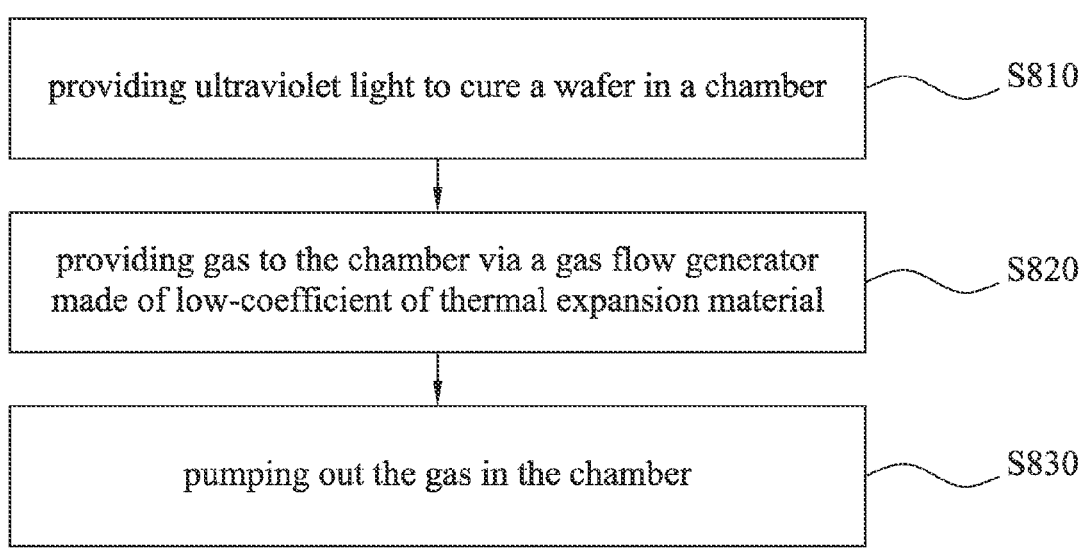
FIG. 5 is a flowchart diagram of a method of ultraviolet curing the wafer according to one or various embodiments of the present disclosure.

Another aspect of the present disclosure provides a method of ultraviolet curing the wafer 900. FIG. 5 is a flowchart diagram of the method of ultraviolet curing the wafer 900 according to one or various embodiments of the present disclosure. To describe clarified, the method can be applied to, but should not be not limited to, the ultraviolet curing apparatus of FIG. 1. Reference is made both to FIG. 1 and FIG. 5. As shown in act S810, ultraviolet light is provided to cure the wafer 900 disposed in the chamber 100 of the ultraviolet curing apparatus. The ultraviolet light can be provided by the ultraviolet lamp 300 disposed on the chamber 100, and the ultraviolet light can illuminate the wafer 900 through the opening 206 of the gas flow generator 200 to cure the wafer 900. Subsequently, as shown in act S820, the gas is provided to the chamber 100 via the gas flow generator 200 in the chamber 100. For example, in FIG. 1, the gas supplier 230 can be connected to the top liner 210, and provide the gas to the chamber 100 via the top liner 210 and the bottom liner 220. In addition, the gas flow generator 200 can be made of low-coefficient of thermal expansion material.

Next, as shown in act S830, the gas in the chamber 100 is pumped out from the gas flow generator 200. For example, in FIG. 1, the pump 240 can be connected to the bottom liner 220 for pumping out the gas in the chamber 100 via the top liner 210 and the bottom liner 220. Therefore, the gas flow generator 200 can generate the gas flow 208 in the chamber 100, and the gas flow 208 can remove the exhaust released from the wafer 900 out of the chamber 100. It should be noticed that the flow chart of FIG. 5 shows exemplary acts, but they are not necessarily performed in the order shown. Acts may be added, replaced, changed order, and/or eliminated as appropriate, in accordance with the spirit and scope of disclosed embodiments.

In one or more embodiments, the method further includes an act of:

The wafer 900 is heated while curing the wafer 900. For example, the wafer 900 may be disposed on the plate 400, and may be heated by the heater 410 of the plate 400. For example, in FIG. 1, the plate 400 may include a heater 410 to heat the wafer 900. The wafer 900 may be heated to 385° C., however, the scope of the claimed disclosure should not limited to this aspect. In this situation, when the wafer 900 is heated by the heater 410, a portion of the heat may transfer to the bottom liner 220, such that the bottom liner 220 is heated. In addition, since the ultraviolet light illuminates the wafer 900 through the top liner 210 and the bottom liner 220, the top liner 210 may be also heated by the ultraviolet light. In other words, the top liner 210 and the bottom liner 220 may be heated simultaneously when ultraviolet curing the wafer 900. Therefore, a temperature difference may exist between the top liner 210 and the bottom liner 220. However, since the top liner 210 and the bottom liner 220 are made of low-coefficient of thermal expansion material as mentioned above, the frictions between the top liner 210 and the bottom liner 220 can be reduced. Furthermore, when the frictions are reduced, there can be no particle produced between the top liner 210 and the bottom liner 220, such that the wafer pollution issue can be solved, and the yield rate of the wafer 900 can be improved.

According to the embodiments mentioned above, one form of the present disclosure provides the ultraviolet curing apparatus. The ultraviolet curing apparatus includes the chamber 100, the gas flow generator 200, and the ultraviolet lamp 300. The gas flow generator 200 includes the top liner 210 and the bottom liner 220 coupled to each other. The top liner 210 and the bottom liner 220 are disposed in the chamber 100, and are made of low-coefficient of thermal expansion material. The ultraviolet lamp 300 is disposed on the chamber 100 and is configured for providing ultraviolet light.

Another form of the present disclosure provides the ultraviolet curing apparatus. The ultraviolet curing apparatus includes the chamber 100, the plate 400, the top liner 210, the bottom liner 220, and the ultraviolet lamp 300. The plate 400 is disposed in the chamber 100 for supporting the wafer 900. The top liner 210 is disposed in the chamber 100 and above the plate 400. The top liner 210 is made of ceramic. The bottom liner 220 is detachably coupled to the top liner 210 and disposed between the top liner 210 and the plate 400. The bottom liner 220 is made of ceramic. The ultraviolet lamp 300 is disposed on the chamber 100 for providing ultraviolet light to cure the wafer 900.

Yet another form of the present disclosure provides the method of ultraviolet curing the wafer 900. The method includes the following acts of: (The acts are not recited in the sequence in which the acts are performed. That is, unless the sequence of the acts is expressly indicated, the sequence of the acts is interchangeable, and all or part of the acts may be simultaneously, partially simultaneously, or sequentially performed.)

Ultraviolet light is provided to cure the wafer 900 disposed in the chamber 100 of the ultraviolet curing apparatus. The gas is provided to the chamber 100 via the gas flow generator 200 in the chamber 100. The gas flow generator 200 can be made of low-coefficient of thermal expansion material. The gas in the chamber 100 is pumped out from the gas flow generator 200.

According to some embodiments, the coefficient of thermal expansion (CTE) of the low-coefficient of thermal expansion material may be about $1\times10^{-6}/°$ C. to $1\times10^{-5}/°$ C. The low-coefficient of thermal expansion material may be made of ceramic, and the material of the ceramic may be aluminum oxide ($Al_2O_3$), silicon carbon (SiC), zirconium oxide ($ZrO_2$), silicon oxide ($Si_3O_4$), or any combination thereof. With the low-coefficient of thermal expansion material, the temperature effect of the top liner 210 and the bottom liner 220 can be reduced.

According to some embodiments, the top liner 210 can have at least one recess 214, and the bottom liner 220 can include at least one pin 232, the pin 232 is tightly coupled to the recess 214. In other words, the pin 232 and the recess 214 are form a tight fit, such that the sliding motion between the top liner 210 and the bottom liner 220 can be reduce or restrain, and the whole structure of the gas flow generator 200 can be strengthen.

Although the embodiments have been described in detail, it should be understood that various changes, substitutions and alterations can be made herein without departing from the spirit and scope of the embodiments as defined by the appended claims. For example, the low-coefficient of thermal expansion material is not limited to the materials mentioned above.

Moreover, the scope of the present application is not intended to be limited to the particular embodiments of the process, machine, manufacture, and composition of matter, means, methods, and steps described in the specification. A person having ordinary skill in the art can readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An ultraviolet curing apparatus, comprising:
    a chamber;
    a gas flow generator comprising a top liner and a bottom liner coupled to each other, wherein the top liner and the bottom liner are disposed in the chamber, and the top liner and the bottom liner consist essentially of low-coefficient of thermal expansion material; and
    an ultraviolet lamp disposed on the chamber for providing ultraviolet light, wherein the top liner and the bottom liner each consisting of a single liner.

2. The ultraviolet curing apparatus of claim 1, wherein a coefficient of thermal expansion of the low coefficient of thermal expansion material is about $1\times10^{-6}/°$ C. to $1\times10^{-5}/°$ C.

3. The ultraviolet curing apparatus of claim 1, wherein the low coefficient of thermal expansion material is ceramic.

4. The ultraviolet curing apparatus of claim 1, wherein the top liner has at least one recess, and the bottom liner comprises at least one pin, the pin is tightly coupled to the recess.

5. The ultraviolet curing apparatus of claim 4, wherein a shape of the pin is cylindrical, and a shape of the recess is round.

6. The ultraviolet curing apparatus of claim 4, wherein a shape of the pin is oval, and a shape of the recess is oval.

7. The ultraviolet curing apparatus of claim 1, wherein the gas flow generator further comprises:
    a gas supplier for providing gas to the chamber; and
    a pump for pumping out the gas in the chamber, wherein the gas supplier and the pump are disposed opposite to each other.

8. The ultraviolet curing apparatus of claim 1, further comprising:
    a plate disposed in the chamber for supporting a wafer.

9. The ultraviolet curing apparatus of claim 8, wherein the plate comprises a heater.

10. The ultraviolet curing apparatus of claim 1, wherein the top liner and the bottom liner are both ring-shaped, and the top liner and the bottom liner form an opening therein to allow the ultraviolet light to pass therethrough.

11. An ultraviolet curing apparatus, comprising:
    a chamber;
    a plate disposed in the chamber for supporting a wafer;
    a top liner disposed in the chamber and above the plate, wherein the top liner consists essentially of ceramic;
    a bottom liner detachably coupled to the top liner and disposed between the top liner and the plate, wherein the bottom liner consists essentially of ceramic; and
    an ultraviolet lamp disposed on the chamber for providing ultraviolet light to cure the wafer, wherein the top liner and the bottom liner each consisting of a single liner.

12. The ultraviolet curing apparatus of claim 11, wherein the material of the ceramic is aluminum oxide ($Al_2O_3$), silicon carbon (SiC), zirconium oxide ($ZrO_2$), silicon oxide ($Si_3O_4$), or any combination thereof.

13. The ultraviolet curing apparatus of claim 11, wherein the bottom liner is tightly coupled to the top liner.

14. The ultraviolet curing apparatus of claim 11, further comprising:
    a gas supplier connected to the top liner.

15. The ultraviolet curing apparatus of claim 11, further comprising:
    a pump connected to the bottom liner.

16. The ultraviolet curing apparatus of claim 15, wherein the top liner and the bottom liner form an inlet gas flow channel and an outlet gas flow channel separated from each other, the gas supplier is connected to the inlet gas flow channel, and the pump is connected to the outlet gas flow channel.

17. The ultraviolet curing apparatus of claim 16, wherein the top liner has a first inlet hole, and the bottom liner has a first groove and at least one first outlet hole, the first groove is connected to the first inlet hole and the first outlet hole to form the inlet gas flow channel.

18. The ultraviolet curing apparatus of claim 17, wherein the top liner and the bottom liner are both ring-shaped, the top liner and the bottom liner form an opening therein, and the first outlet hole faces the opening.

19. The ultraviolet curing apparatus of claim 16, wherein the bottom liner has a second groove, at least one second inlet hole, and a second outlet hole, the second groove is connected to the second inlet hole and the second outlet hole to form the outlet gas flow channel.

20. The ultraviolet curing apparatus of claim 19, wherein the top liner and the bottom liner are both ring-shaped, the top liner and the bottom liner form an opening therein, and the second inlet hole faces the opening.

\* \* \* \* \*